(12) United States Patent
Sakiyama et al.

(10) Patent No.: US 9,754,769 B2
(45) Date of Patent: Sep. 5, 2017

(54) METROLOGY METHODS TO DETECT PLASMA IN WAFER CAVITY AND USE OF THE METROLOGY FOR STATION-TO-STATION AND TOOL-TO-TOOL MATCHING

(71) Applicant: Lam Research Corporation, Fremont, CA (US)

(72) Inventors: Yukinori Sakiyama, West Linn, OR (US); Yaswanth Rangineni, Beaverton, OR (US); Jeremy Tucker, Portland, OR (US); Douglas Keil, West Linn, OR (US); Edward Augustyniak, Tualatin, OR (US); Sunil Kapoor, Vancouver, WA (US)

(73) Assignee: Lam Research Corporation, Fremont, CA (US)

( * ) Notice: Subject to any disclaimer, the term of this patent is extended or adjusted under 35 U.S.C. 154(b) by 3 days.

(21) Appl. No.: 14/854,586

(22) Filed: Sep. 15, 2015

(65) Prior Publication Data

US 2017/0076921 A1   Mar. 16, 2017

(51) Int. Cl.
*H01L 21/02*   (2006.01)
*H01J 37/32*   (2006.01)
(Continued)

(52) U.S. Cl.
CPC .. *H01J 37/32935* (2013.01); *C23C 16/45544* (2013.01); *C23C 16/50* (2013.01);
(Continued)

(58) Field of Classification Search
CPC ......... H01L 21/32136; H01L 21/67017; H01L 21/67069; H01L 21/67253; H01L 21/3065; H01L 21/02274
See application file for complete search history.

(56) References Cited

U.S. PATENT DOCUMENTS

| | | | |
|---|---|---|---|
| 2002/0179250 A1* | 12/2002 | Veltrop | H01J 37/32174 156/345.48 |
| 2003/0145950 A1* | 8/2003 | Hirose | C23C 16/4581 156/345.43 |

(Continued)

*Primary Examiner* — Jaehwan Oh
(74) *Attorney, Agent, or Firm* — Martine Penilla Group, LLP

(57) ABSTRACT

A process chamber for detecting formation of plasma during a semiconductor wafer processing, includes an upper electrode, for providing a gas chemistry to the process chamber. The upper electrode is connected to a radio frequency (RF) power source through a match network to provide RF power to the wafer cavity to generate a plasma. The process chamber also includes a lower electrode for receiving and supporting the semiconductor wafer during the deposition process. The lower electrode is disposed in the process chamber so as to define a wafer cavity between a surface of the upper electrode and a top surface of the lower electrode. The lower electrode is electrically grounded. A coil sensor is disposed at a base of the lower electrode that extends outside the process chamber. The coil sensor substantially surrounds the base of the lower electrode. The coil sensor is configured to measure characteristics of RF current conducting through the wafer cavity. The characteristics of the RF current measured by the coil sensor are used to confirm presence of plasma within the wafer cavity.

18 Claims, 6 Drawing Sheets

(51) Int. Cl.
    *C23C 16/455*     (2006.01)
    *C23C 16/50*     (2006.01)
    *C23C 16/52*     (2006.01)
    *H01L 21/67*     (2006.01)

(52) U.S. Cl.
    CPC ........ *C23C 16/52* (2013.01); *H01J 37/32183* (2013.01); *H01L 21/0228* (2013.01); *H01L 21/02274* (2013.01); *H01L 21/67253* (2013.01)

(56) References Cited

U.S. PATENT DOCUMENTS

| | | | | |
|---|---|---|---|---|
| 2003/0178140 A1* | 9/2003 | Hanazaki | .......... | H01J 37/32935 156/345.28 |
| 2005/0067386 A1* | 3/2005 | Mitrovic | .......... | H01J 37/32082 219/121.43 |
| 2008/0237031 A1* | 10/2008 | Sato | .......... | H01J 37/32082 204/164 |
| 2009/0242132 A1* | 10/2009 | Sato | .......... | H01J 37/32091 156/345.43 |
| 2010/0096361 A1* | 4/2010 | Fischer | .......... | H01J 37/304 216/61 |
| 2011/0146703 A1* | 6/2011 | Chen | .......... | C23C 16/0245 134/1.1 |
| 2011/0234201 A1* | 9/2011 | Tanaka | .......... | H01J 37/32183 324/76.39 |
| 2012/0086464 A1* | 4/2012 | Hanawa | .......... | G01R 19/0061 324/632 |
| 2013/0284370 A1* | 10/2013 | Collins | .......... | H05H 1/46 156/345.28 |
| 2014/0106573 A1* | 4/2014 | Terasaki | .......... | H01J 37/321 438/771 |
| 2014/0349417 A1* | 11/2014 | O'Neill | .......... | H01L 22/12 438/5 |
| 2015/0279624 A1* | 10/2015 | Toyota | .......... | H01J 37/32146 156/345.28 |
| 2016/0172226 A1* | 6/2016 | West | .......... | H02N 13/00 438/782 |

* cited by examiner

US 9,754,769 B2

METROLOGY METHODS TO DETECT PLASMA IN WAFER CAVITY AND USE OF THE METROLOGY FOR STATION-TO-STATION AND TOOL-TO-TOOL MATCHING

FIELD OF THE INVENTION

The present embodiments relate to semiconductor equipment tools, and more particularly, to process chambers used for deposition of material layers over semiconductor wafers, and metrology systems and methods for detecting when plasma is present in a cavity of the process chamber.

BACKGROUND

Description of the Related Art

Atomic Layer deposition (ALD) is a plasma deposition technique that is used to deposit thin films of deposition chemistry on a substrate, such as a semiconductor wafer. The ALD is performed by exposing a surface of the semiconductor wafer to alternate gaseous deposition chemistries. The gaseous deposition chemistries are inserted into an ALD chamber sequentially in a non-overlapping manner to allow thin films to grow uniformly on the surface of the semiconductor wafer. To enable application of gaseous deposition chemistries, ALD systems may include a vaporizer to convert each of the deposition chemistries in liquid form to gaseous form in a controlled manner and deliver the gaseous form of the deposition chemistries to the ALD chamber during deposition process. When applied on a surface of the semiconductor wafer (or simply referred to as the "wafer"), molecules of a gaseous deposition chemistry react with the wafer surface to form a thin film.

Chambers used for ALD process include wafer-receiving mechanisms, such as pedestals, electrostatic chucks (ESCs), etc., for supporting the semiconductor wafer during processing, and an upper electrode for providing gaseous deposition chemistries into the chamber. The pedestal or ESC acts as a lower electrode. The upper electrode and the pedestal are made of a conductive material that is capable of withstanding high temperatures that exist within the process chambers during a deposition process.

Thin film deposition can be achieved using a plasma in an ALD chamber, for example. The species (i.e., deposition chemistries) are energized in the plasma and the energized species help to induce reactions with features formed on a surface of the wafer. In an ALD chamber, plasma is generated by applying radio frequency (RF) power to excite the gaseous form of the deposition chemistry supplied to the ALD chamber. The RF power is provided by a RF power source through the upper electrode of the ALD chamber.

Metrology tools are used to measure the RF characteristics of the RF power supplied to the ALD chamber. Some of the RF characteristics that are measured include RF voltage and total current. A common metrology tool used is a voltage-current (VI) probe. The VI probe is typically located close to where the RF power is input to the RF powered upper electrode. However, because of its location (i.e., proximity to the input of the powered upper electrode), the VI probe measures a sum of the current passing into the ALD chamber, e.g., the current related to parasitic plasma and parasitic capacitive coupling to ground. Since the VI probe measurement is made proximate to the input, the measurement will not identify if plasma has been generated between the upper electrode and the wafer surface (i.e., in the wafer cavity).

Determining whether plasma is present in a wafer cavity is especially critical for any chamber that does not provide visual or optical access to the wafer cavity. Without the visual or optical access, one needs to rely on the existing metrology tools to correctly identify when plasma is present. Unfortunately, using existing metrology tools (i.e., VI probes), it is very hard to reliably confirm ignition of plasma in the wafer cavity. The problem is further exacerbated when the parasitic capacitance detected in the chamber is comparable to the capacitance of the wafer cavity.

It is in this context that embodiments of the invention arise.

SUMMARY

Embodiments of the invention define a process chamber that employs a metrology process and tool setup for confirming plasma ignition within a wafer cavity defined in the process chamber. The process chamber includes an upper electrode and a lower electrode. A wafer cavity is defined in a region between the upper electrode and the lower electrode of the process chamber and is where plasma is usually formed.

The upper electrode is used to supply deposition chemistries to the wafer cavity and the lower electrode acts as a wafer-receiving mechanism for receiving and supporting a semiconductor wafer during deposition process. The lower electrode, in some implementations, is in the form of a pedestal and the upper electrode acts as a showerhead. The upper electrode is coupled to an RF power source through a match network. The RF power source provides the power to ignite a plasma within the process chamber. In one embodiment, an RF metrology tool, such as voltage-current (VI) probe, is disposed between the RF power source and the upper electrode, and is near an RF power input to the process chamber. The VI probe is used to detect and measure RF characteristics, such as RF voltage and current. Using these measurements, other characteristics can be identified, such as impedance, RF power delivered to the process chamber, etc.

In one embodiment, the process chamber is further configured with a coil sensor, which is usable to measure conductance current of a plasma, when formed in the wafer cavity of the process chamber. In this embodiment, the coil sensor is disposed at a base of the lower electrode that extends outside of the process chamber. For example, the coil sensor is configured to substantially surround a base of the lower electrode. The location of the coil sensor enables the coil sensor to measure characteristics of RF current conducting through the wafer cavity. In one embodiment, the RF current measured by the coil sensor excludes RF current generated due to parasitic plasma and, in some instances, parasitic capacitance to ground. The RF characteristics detected by the coil sensor can be used to correctly confirm ignition of plasma in the wafer cavity, as will be described in more detail below. Accordingly, the coil sensor, along with the VI probe, defines a metrology system and method for confirming the presence of plasma in the wafer cavity.

In one embodiment, a process chamber for detecting formation of plasma within a wafer cavity during a semiconductor wafer processing, is disclosed. The process chamber includes an upper electrode with a plurality of inlets for supplying a gas chemistry to the process chamber. The upper electrode is connected to a radio frequency (RF) power source through a match network to provide RF power to generate a plasma. The process chamber also includes a lower electrode for receiving and supporting the semiconductor wafer during the deposition process. The lower electrode is disposed in the process chamber such that a wafer cavity is defined between a surface of the upper electrode and a top surface of the lower electrode. The lower electrode is electrically grounded. A coil sensor is disposed at a base of the lower electrode that extends outside the process chamber. The coil sensor substantially surrounds the base of the lower electrode. The coil sensor is configured to measure characteristics of an RF current conducting through the wafer cavity. Other currents due to parasitic plasma and/or parasitic capacitive coupling to ground are, in one embodiment, not measured by the coil sensor. The RF current measured by the coil sensor is used to confirm presence of plasma within the wafer cavity.

In one embodiment, the process chamber further includes a VI probe is disposed outside the process chamber between the RF power source and the upper electrode to measure characteristics of the RF power delivered to the process chamber.

In another embodiment, a process chamber is disclosed. The process chamber includes an upper electrode coupled to a radio frequency (RF) power supply. The process chamber further includes a lower electrode coupled to ground. A wafer cavity is defined between the upper electrode and the lower electrode. A base is coupled to the lower electrode. The base is configured to extend into the process chamber from below the process chamber. The base has an inner portion that is inside the process chamber and an outer portion that is outside the process chamber. A circular channel is defined around the outer portion of the base. A coil sensor is disposed in the circular channel so that the coil sensor substantially surrounds the outer portion of the base. A first end of the coil sensor is connected to an input-output controller and a second end of the coil sensor is proximate to the first end when the coil sensor is disposed in the circular channel.

In one embodiment, a method for measuring operational parameters of a process chamber is disclosed. The method includes operating the process chamber using a first power level that is lower than a power required to ignite a plasma in a wafer cavity of the process chamber. A first current value conducting through a base of a lower electrode of the process chamber is measured for a first voltage detected in the process chamber during operation of the process chamber with the first power level. The process chamber is operated using a second power level that is lower than the power required to ignite the plasma in the wafer cavity. The second power level is higher than the first power level. A second current value conducting through the base of the lower electrode of the process chamber is measured for a second voltage detected in the process chamber during operation of the process chamber with the second power level. Using the first and the second voltage and the first and the second current value measurements, a determination is made for when plasma is ignited in the wafer cavity during a plasma process operation that is run using a process power level that is higher than the first power level. A process current value conducting through the base of the lower electrode is measured for a process voltage detected in the process chamber during the plasma process operation with the process power level and the determination when the plasma is ignited in the wafer cavity is made during the plasma process operation based on a comparison of the process voltage and the process current value against the first and second voltages and the first and the second current values.

Embodiments of the disclosure provide a metrology system for confirming plasma ignition within the wafer cavity of a process chamber used for processing the wafer. In a process chamber that does not include a visual or an optical access, correctly identifying plasma ignition is very useful as it allows confirmation of proper chamber operation. The metrology system includes a coil sensor that is wrapped at least partially around a base of the lower electrode that extends outside of the process chamber. The location of the coil sensor enables the coil sensor to measure the RF current conducting through the wafer cavity and the lower electrode to ground. The measured RF current is used to reliably confirm ignition of plasma in the wafer cavity.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DESCRIPTION

Figure 1:
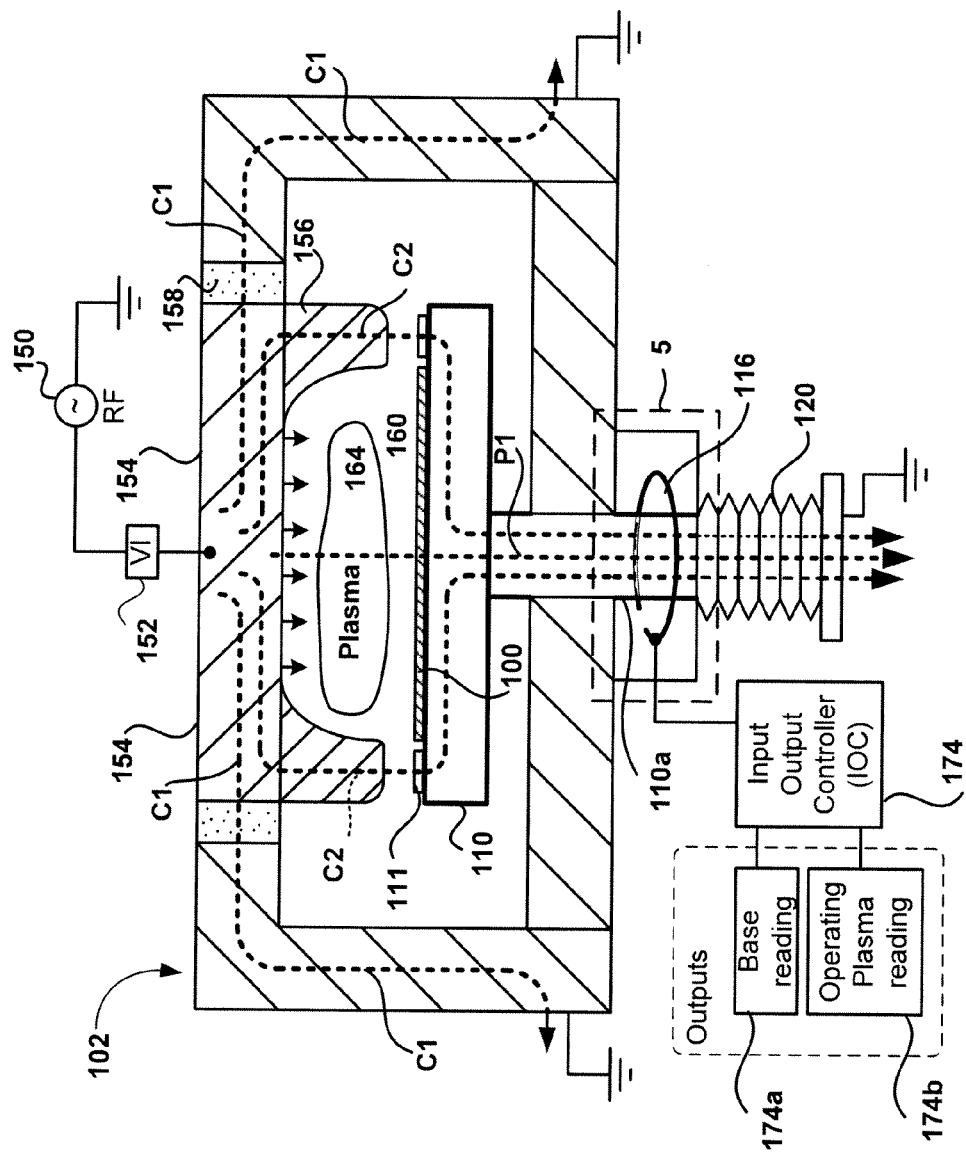
FIG. 1 illustrates a simplified block diagram of a wafer process chamber used in a deposition process to form thin films on a surface of a wafer, in one embodiment of the invention.

Embodiments of the disclosure define metrology methods and systems for detecting RF current through a wafer cavity defined in a process chamber, which is indicative of plasma generation within the wafer cavity. In some embodiments, the process chamber is used for deposition processing, e.g., PECVD or ALD processing. The metrology system, in one embodiment, includes a coil sensor that is provided at a base of a lower electrode, outside of the process chamber. The current detected by the coil sensor is used to confirm plasma ignition in the wafer cavity.

In one embodiment, the process chamber includes an upper electrode that is connected to an RF power source and a lower electrode that is electrically grounded. A wafer cavity is defined in a region between the upper electrode and the lower electrode. The wafer cavity represents a process region within the process chamber where a plasma is usually formed and a surface of a semiconductor wafer (or simply a "wafer") is processed. During a deposition process, plasma is ignited in the wafer cavity using the gas chemistry and the RF power provided by the upper electrode and the surface of the wafer is exposed to the plasma.

A voltage-current (VI) probe is disposed outside the process chamber between the RF power source and the upper electrode. The VI probe is used to measure RF characteristics of the RF power at the powered upper electrode. The RF characteristics measured by the VI probe includes the current conducting through the wafer cavity and the current through any parasitic plasma and/or parasitic capacitive coupling to ground. In some embodiments, the VI probe provides data used to calculate a phase difference related to the measured voltage and current. Capacitive coupling occurs when a gap is present between two conductive components through which current can pass. For example, capacitive coupling occurs in the process chamber due to current passing through a gap between the powered upper electrode and the lower electrode, which is electrically grounded. Similarly, capacitive coupling occurs due to current passing through a gap between the powered upper electrode and a wall of the process chamber that is electrically grounded. Such capacitive coupling is deemed "parasitic" as the current is not intended to pass through these components. As the parasitic capacitance becomes comparable with the capacitance of the wafer cavity, it becomes increasingly harder to confirm ignition of plasma within the wafer cavity by just relying on the RF characteristics measurements provided by the VI probe alone.

In order to accurately determine onset of the plasma within the wafer cavity, a coil sensor is disposed at a base of the lower electrode that extends outside of the process chamber. The coil sensor partially or substantially surrounds the lower electrode. The coil sensor is configured to detect RF current conducting through the wafer cavity and the lower electrode to ground. The current detected by the coil sensor is therefore used to confirm ignition of plasma in the wafer cavity.

It should be appreciated that the present disclosure can be implemented in numerous ways, such as a process, an apparatus, a system, a device, or a method. Several embodiments will now be described with reference to the drawings.

Thin film deposition is implemented in an atomic layer deposition (ALD) system, a plasma-enhanced chemical vapor deposition system (PECVD), etc. Different forms of ALD or PECVD system can be employed for performing thin film deposition. For example, the ALD or the PECVD system may include one or more process chambers or "reactors" with each process chamber housing one or more wafers for wafer processing. In some implementations, each process chamber may include one or more stations, with each station housing a wafer. Each process chamber or each station in a process chamber may have receiving and holding mechanism to receive and hold the wafer in a defined position with or without motion (e.g., rotation, vibration, agitation, etc.) within that position. In an ALD system, for example, a plurality of deposition chemistries are applied in a sequential manner to the surface of the wafer in a uniform way so as to deposit multiple layers of thin film on the wafer surface. As a result, the multiple layers of thin film deposition may all occur in one station of a process chamber or each film deposition may occur at a different station of the process chamber. In a PECVD system, for example, each station of a process chamber (in a multi-station process chamber) may be used to deposit a thin film on the surface of a different wafer. The various implementations of the disclosure are described with reference to the use of a metrology system in either an ALD system or a PECVD system. However, such implementations are not restricted to the ALD or the PECVD system but may be extended to other deposition systems, where accurate measurement of process parameters is needed.

FIG. 1 illustrates a simplified block diagram of an example process chamber 102 used to process a wafer 100, in one embodiment. The process chamber 102 includes one or more chamber walls, an upper electrode 154 and a lower electrode 110. The chamber wall is electrically grounded. The upper electrode 154 is electrically coupled to a RF power source 150 through a match network (not shown). A voltage-current (VI) probe 152 is disposed outside the process chamber 102 between the RF power source 150 and the upper electrode 154 and is used to measure RF characteristics of RF power provided to the process chamber 102 through the upper electrode 154. In some implementations, the VI probe 152 is disposed proximal to an RF input to the upper electrode 154. The VI probe 152 may include a distinct voltage sensor (not shown) and a current sensor (not shown). The upper electrode 154 also functions as a showerhead, as it provides gasses into the process chamber 102.

In some implementations, the upper electrode 154 is made of a conductive material, such as aluminum or aluminum nitride. In one implementation where the upper electrode 154 is made of aluminum nitride, the upper electrode 154 may have an additional layer of tungsten coating over the aluminum nitride. Alternately, the upper electrode 154 may be made of ceramic or any other conductive material that is capable of withstanding the temperature and processing conditions inside the process chamber 102.

The lower electrode 110 functions as a pedestal for supporting the semiconductor wafer. The lower electrode 110, in some implementations, is electrically grounded. In some implementations, the lower electrode 110 is made of a conductive material, such as aluminum or aluminum nitride. In one embodiment, a base 110a of the lower electrode 110 extends outside the process chamber 102. The lower electrode 110 can be moved up or down depending on processing. A bellows 120 is shown to cover portions of moving parts of the base 110a, which enable the up and down movement of the lower electrode 110.

In an alternate embodiment, a separate base 110a may be coupled to the lower electrode 110. In this embodiment, the base 110a is disposed at the bottom of the process chamber 102 such that an inner portion of the base 110a extends into the process chamber 102 from below the process chamber 102 and an outer portion of the base 110a is disposed outside the process chamber 102. The base 110a may include moving parts that allow the base 110a and the lower electrode 110 coupled to the base 110a to move up or down. A bellows 120 is disposed to cover portions of the moving parts of the base 110a.

A wafer cavity 160 is defined between the upper electrode 154 and the lower electrode 110. The wafer cavity 160 is a region in the process chamber where the deposition chemistries are introduced in gaseous form through a plurality of inlets defined on a surface of the upper electrode 154 facing the wafer cavity 160, and a plasma 164 is ignited using RF power supplied through the upper electrode 154.

In one embodiment, a ring 156 is disposed at an outer periphery of the surface of the upper electrode 154 facing the wafer cavity 160. The ring 156 defines a pocket within the wafer cavity 160 to allow the generated plasma 164 to be substantially contained inside the pocket. The ring 156, in one implementation, is made of a ceramic material. In another implementation, the ring 156 is made of any other conductive material that is capable of withstanding the processing conditions inside the process chamber 102 during the deposition process. In one implementation, the thickness and the depth of the ring 156 is designed so as to enable successful plasma containment.

A dielectric material 158 is disposed between the upper electrode 154 and wall of the process chamber 102. The dielectric material 158 provides insulation to the wall of the process chamber 102.

In one embodiment, an edge ring 111 is disposed on a top surface of the lower electrode 110. When present, the edge ring 111 is disposed immediately adjacent to and sufficiently surrounds a wafer 100 when the wafer 100 is received and supported on the lower electrode 110. The edge ring 111, in one embodiment, is made of a conductive material, such as ceramic.

A coil sensor 116 is provided at a base 110a of the lower electrode 110 that extends outside the process chamber 102. A more detailed explanation of the location of the coil sensor 116, the different components of a region 5 of the process chamber 102 where the coil sensor 116 is disposed, and the components of the coil sensor 116 will be provided with reference to FIGS. 2A, 2B and 2C. In some implementations, the coil sensor 116 is an induction coil-based sensor that is disposed to partially or substantially surround the base 110a of the lower electrode 110. The coil sensor 116 is used to measure RF characteristics (e.g., RF current flowing through the wafer cavity 160) of the RF power delivered to the process chamber 102. The location of the coil sensor 116 at the base 110a of the lower electrode 110 allows the coil sensor 116 to exclude RF current flowing through parasitic plasma. The parasitic plasma, for example, is generated in a region that is outside of the wafer cavity 160 defined over the lower electrode 110. As a result, the RF current flows through the parasitic plasma away from the lower electrode 110 and is, therefore, not detected by the coil sensor 116. Similarly, the coil sensor 116, in some embodiments, excludes some of the RF current due to parasitic capacitance detected in the process chamber 102. The parasitic capacitance, for example, occurs when the RF current flows through a gap between the upper electrode and a wall of the process chamber 102, away from the lower electrode 110. As a result, the coil sensor 116 does not detect the RF current that flows through the wall of the process chamber 102 to ground.

In one implementation, the coil sensor 116 is coupled to an Input-Output controller (IOC) 174. The IOC 174 is configured to receive signals related to RF characteristics measured and outputted by the coil sensor 116 and interpret the signals. In another implementation, the VI probe 152 may be coupled to the IOC 174 so that RF characteristics measured by the VI probe 152 may be provided as signals to the IOC 174. The IOC 174 interprets the signals generated by the VI probe 152 to determine a base line of measurement for the voltage measured by the VI probe 152 and the current measured by the coil sensor 116 for a base power level applied to the process chamber. Once the base line measurement is set for the process chamber 102, the current measured by the coil sensor 116 and the voltage determined by the VI probe 152 for a power level that is different from the base power level may be compared against the base line measurement to determine if plasma is ignited or not in the process chamber 102. As part of interpreting the signals, the IOC 174 may provide appropriate information for rendering on a user interface (not shown) of a computing device (not shown) that is coupled to the IOC 174.

In some implementations, the information provided by the IOC 174 may include historical measurements of the signals, an alarm message when a particular RF characteristic extends outside a window of acceptable parameter, etc. As the IOC 174 receives output signals from the coil sensor 116 in-situ during the deposition process, the output signals reflect current process conditions within the wafer cavity 160. As a result, analyzing the current process conditions would provide an insight into presence of plasma in the wafer cavity 160 and what RF characteristics provide consistently successful indication of plasma ignition in the wafer cavity 160. For example, the current process conditions detected in the process chamber 102 may indicate that either the plasma was not ignited in the wafer cavity 160 or the density of the plasma was too low to perform a successful deposition process. Such process conditions would lead to less than optimal deposition process within the process chamber. As a result, as part of the analysis, current process conditions may be compared against the historical measurements that resulted in successful deposition process to determine which parameter needs to be adjusted to produce a level of plasma that results in an optimal wafer deposition process. This process can be used for assessing the process conditions for station-to-station matching as well as tool-to-tool matching.

In some implementations, the RF characteristics measured by the coil sensor 116 and the VI probe 152 are used to measure two sets of outputs. In some implementations, the two sets of RF characteristics measured by the coil sensor 116 and VI probe 152 are transmitted to the IOC 174 as output signals and the IOC 174 processes the output signals and determines whether plasma is ignited or not ignited in the wafer cavity 160. The first set of output relates to a base reading 174a of the RF characteristics and the second set of output relates to an operating plasma reading 174b. In one implementation, the first set of output may include at least two RF characteristics measurements and the second set of output may include at least one RF characteristics measurement. Detection of the base reading 174a and using the base reading 174a to determine plasma ignition within the wafer cavity 160 will be described in more detail with reference to FIG. 5.

In one implementation, a small amount of RF power 150 is supplied to the wafer cavity 160 and the coil sensor 116 is used to measure the RF characteristics for the supplied RF power 150. The measured RF characteristics represent a first reading for the first set that is part of the base reading measurement 174a. For example, the coil sensor 116 may measure the RF current flowing through the wafer cavity 160 for the applied low RF power that corresponds to a first voltage detected in the process chamber and this measured RF current and first voltage represents a first reading of the first set of base RF current (one of the RF characteristics component in the base reading 174a). The magnitude of the first RF power provided to define the base reading is known to not ignite plasma in the wafer cavity 160. In one implementation, the first RF power supplied to obtain base reading measurement is less than 150 W. In this implementation, the RF current measured by the coil sensor is less than 6 amps. Next, a second RF power is applied to the process chamber 102. The second RF power is also known to not ignite plasma in the wafer cavity 160. The RF characteristics for the second RF power are measured by the coil sensor 116 and the VI probe 152. The measured RF characteristics represent a second reading of the base reading measurement 174a. The base reading measurement 174a for the process chamber 102 is maintained by the IOC 174 and is used in analyzing subsequent RF characteristics measurements when different RF power is applied to the process chamber 102 to determine presence of plasma in the wafer cavity 160. In some implementations, the first set may include RF characteristic measurements for more than two RF power levels and the base reading measurement 174a may be determined using the measured RF characteristics of the different RF power levels.

Once the base reading measurements 174a for the RF characteristics (e.g., voltage, current) is established using the first set of readings, a second set of RF characteristic measurements is obtained by the coil sensor 116 and the VI probe 152 for a third RF power supplied to the process chamber 102. The third RF power supplied to the process chamber 102 to obtain the second set of RF characteristics may be different from the RF power that was used to generate the base line measurement 174a. The second set of RF characteristics measured by the coil sensor 116 includes the RF current flowing through the wafer cavity and the RF characteristics measured by the VI probe 152 includes at least the voltage and the phase difference between current and voltage.

In order to confirm ignition of plasma 164 in the wafer cavity 160 the second set of RF characteristics measurement is compared against the first set of RF characteristics measurement representing base line reading 174a. Based on the comparison, it can be determined that plasma is either ignited or not ignited in the wafer cavity 160. When it is determined that plasma is ignited in the wafer cavity 160, the measured RF characteristics of the second set correspond to operating plasma reading 174b.

The IOC 174 uses the result of the comparison to generate appropriate informational message for rendering at the user interface.

Figure 2A:
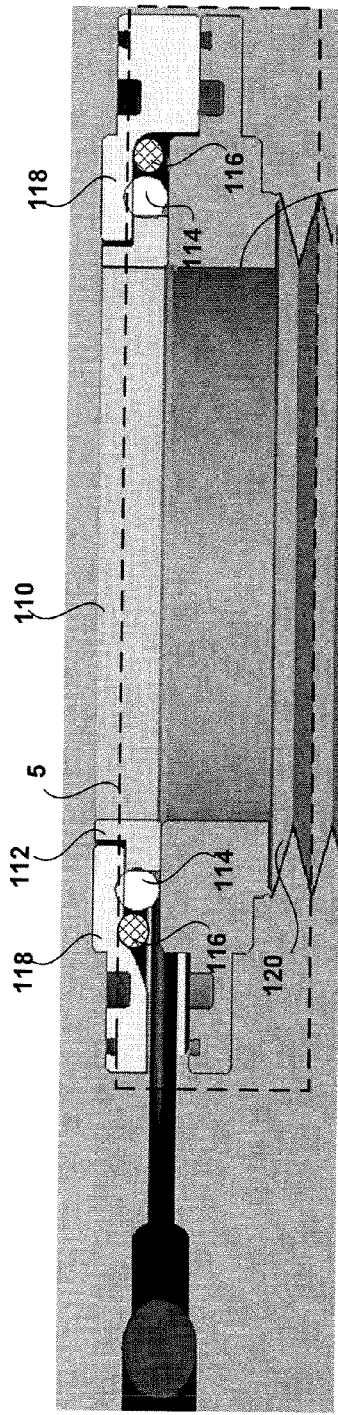
FIG. 2A illustrates an expanded view of a base of a lower electrode illustrated in FIG. 1, in one embodiment of the invention.

FIG. 2A illustrates a magnified cross-sectional view of a lower portion 5 of the process chamber 102 showing the base 110a of the lower electrode 110 wherein a coil sensor 116 is installed, in one embodiment. In one embodiment, the base 110a of the lower electrode 110 where the coil sensor 116 is disposed is located outside of the process chamber 102. The base 110a of the lower electrode 110 includes moving parts that allow the lower electrode 110 to be moved up or down depending on processing of wafer. Portions of the moving parts at the base 110a of the lower electrode 110 are covered by bellows 120. A dielectric insulator 112 is provided immediately adjacent to the base 110a of the lower electrode 110. The dielectric insulator 112 protects adjacent structures of the process chamber 102 by providing sufficient insulation from the RF power flowing through the lower electrode 110. An aluminum clamp 118 is provided immediately adjacent to the dielectric insulator 112. The aluminum clamp 118, in some embodiments, is provided to hold different parts associated with the lower electrode 110 and/or the process chamber 102 together. An O-ring 114 is provided in a region defined between the aluminum clamp 118 and the dielectric insulator 112. In one embodiment, the O-ring is made of dielectric material. The O-ring 114, in some embodiments, acts to seal any gaps between the dielectric insulator 112 and the aluminum clamp 118. A coil sensor 116 is disposed between the O-ring 114 and the aluminum clamp 118 of the process chamber 102. In some embodiments where the O-ring 114 is not present, the coil sensor may be disposed adjacent to and either partially or substantially surrounds the base 110a of the lower electrode 110.

In one embodiment, a circular channel is defined around the base 110a of the lower electrode 110. In this embodiment, the coil sensor 116 is disposed in the circular channel so as to substantially surround the base 110a of the lower electrode 110. The coil sensor 116 is disposed within the circular channel such that a first end of the coil sensor 116 is proximate to a second end of the coil sensor 116. In one embodiment the first end of the coil sensor 116 is connected to an input-output controller (IOC) so that the measurements from the coil sensor 116 can be transmitted to the IOC. Based on the location where the coil sensor 116 is disposed, the coil sensor 116 is able to accurately measure the RF characteristics for the RF current conducting through the wafer cavity 160 during a deposition process, to correctly confirm presence of plasma within the wafer cavity 160.

Figure 2B:
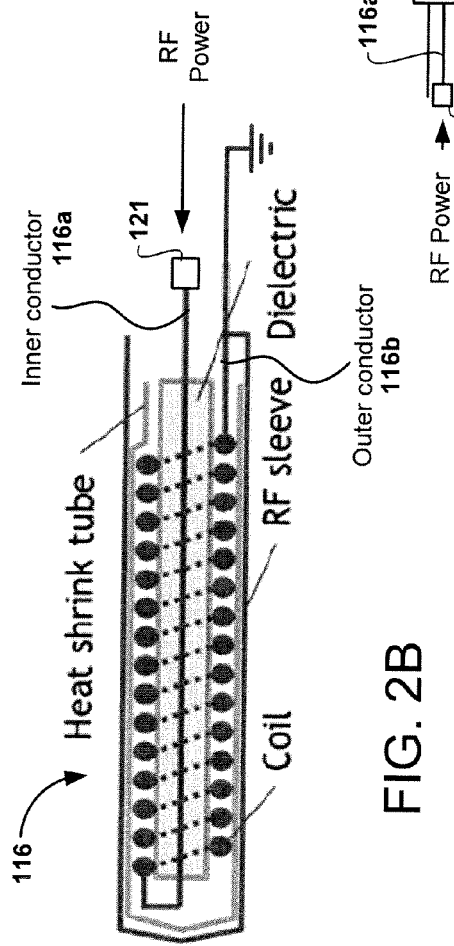
FIG. 2B illustrates a cross section view of a coil sensor used in FIG. 2A, in one embodiment of the invention.

FIG. 2B illustrates a cross-section of a coil sensor 116 used to confirm presence of plasma in the wafer cavity 160, in one embodiment. The coil sensor 116, in one embodiment, is an annular-shaped Rogowski coil and includes a helical coil of wire with an inner conductor 116a going through a center of a dielectric material provided therein and returning as a wrapping conductor 116b wrapped around the dielectric material, so that both a first end and a second end of the wire are at the same end of the coil. The annular-shaped coil sensor 116 is disposed to substantially or partially surround the base 110a of the lower electrode 110 so as to measure RF current conducting through the wafer cavity and the lower electrode 110 toward ground. The coil sensor 116 further includes a heat shrink tube disposed outside of the helical coil of wire to provide insulation to the conductive wire contained within. An RF sleeve is disposed outside the heat shrink tube to hold the various components of the coil sensor 116 together. The coil sensor, in one embodiment, is flexible such that the coil sensor can be inserted into a circular channel defined at a base 110a of the lower electrode 110. In one embodiment, the coil sensor is connected to a coaxial connector 121, which in turn is connected to the IOC (not shown) so that the signal transmission from the coil sensor is transmitted through the coaxial connector 121 to the IOC.

Figure 2C:
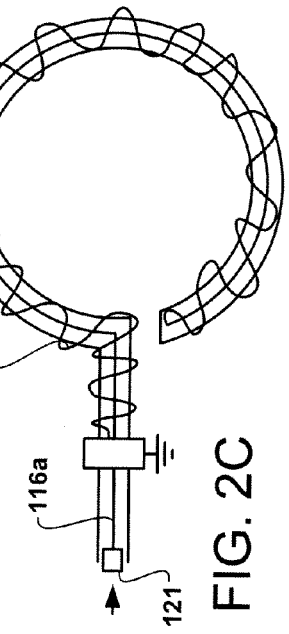
FIG. 2C illustrates a simplified overhead view of the coil sensor of FIG. 2A, in one embodiment of the invention.

FIG. 2C illustrates a top view of the coil sensor 116. As shown, the coil sensor 116 includes an inner conductor 116a to detect the RF current flowing through the lower electrode 110 and a wrapping conductor 116b that is connected to an input-output controller (IOC) (not shown) through a coaxial connector 121. The coil sensor 116 is configured to transmit information related to the detected RF characteristics as output signals to the IOC.

In one embodiment, the coil sensor 116 works in the following manner. A first end of the coil sensor 116 detects the RF current passing through the wafer cavity and the lower electrode. The detected RF current induces a voltage in the coil sensor 116 that is proportional to the detected RF current. A second end of the coil sensor 116 is connected to an input-output controller (IOC) and the voltage output from the coil sensor 116 is provided to the IOC as an output signal. The IOC receives and interprets the output signal, analyzes the interpreted output signal and generates appropriate information for rendering on a user interface at a display screen (i.e., display device) of a computing device (not shown) that is communicatively connected to the IOC.

It should be noted that the Rogowski coil is one type of current transformer that can be used to measure the RF characteristics for the current conducting through the wafer cavity. The embodiments are not restricted to the use of Rogowski coil but may employ other types of current transformers to measure the RF characteristics for the current conducting through the wafer cavity.

Figure 3:
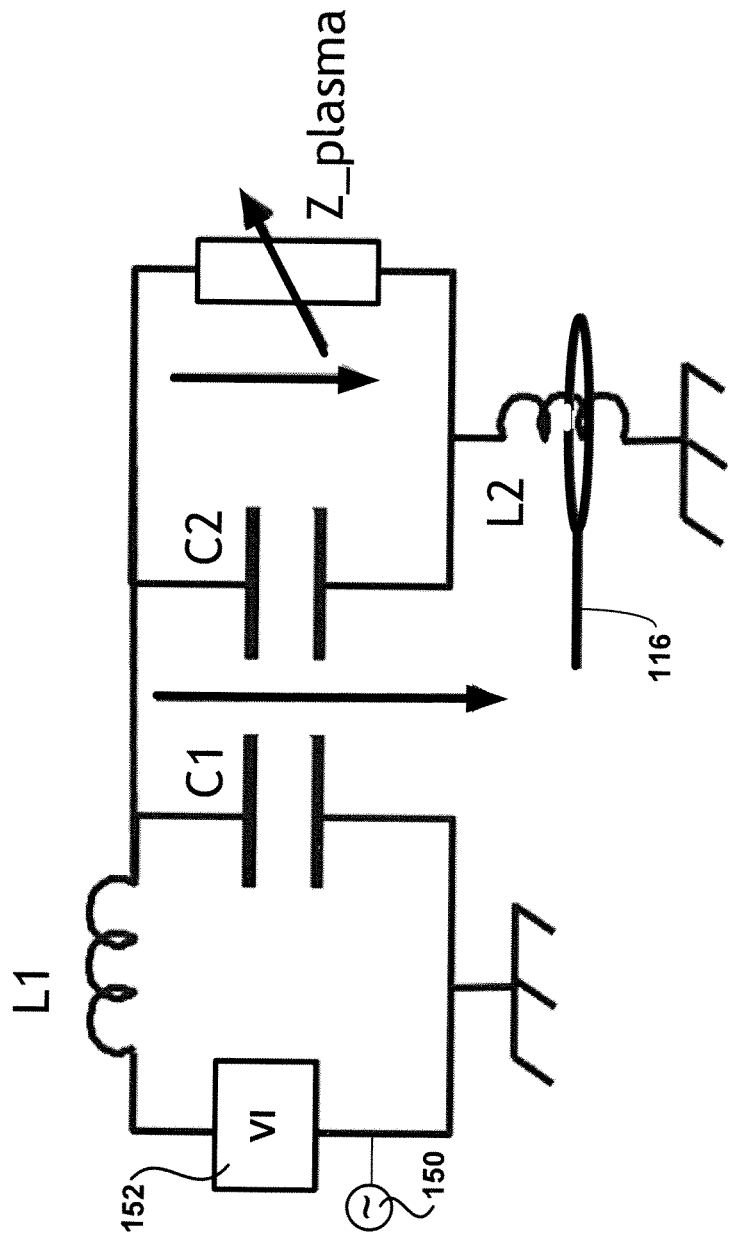
FIG. 3 illustrates an example electrical model showing flow of current through the process chamber, in an embodiment of the invention.

FIG. 3 illustrates an equivalent electric circuit model of a process chamber in which a coil sensor 116 is provided, in one embodiment. The electric circuit model identifies various electrical components that correspond to different parts of the process chamber 102. The process chamber 102, for example, may be used for performing ALD or PECVD. A voltage-current (VI) probe 152 is coupled to an upper electrode outside the process chamber 102 near an RF power input 150 to measure characteristics of the RF power delivered to the process chamber 102 through the upper electrode. A change in RF power results in a change in the RF current flowing through the upper electrode 154. The changing RF current induces a voltage in the upper electrode (which is conductive) as well as in other conductive elements within the process chamber 102. This is represented by inductance L1. The total RF current flowing through the process chamber flows through the inductance L1.

Capacitance C1 relates to a parasitic capacitance that is caused due to current passing through a gap detected between the conductive upper electrode and an electrically grounded wall of the process chamber. Similarly, capacitance C2 relates to a parasitic capacitance that is caused due to current passing through a gap detected between the upper electrode and the lower electrode. A RF current (represented as Z_plasma) flowing through the wafer cavity and lower electrode is caused by varying the RF power supplied to the process chamber. The RF current flowing through the wafer cavity and the lower electrode flows through the second inductance L2. The coil sensor 116 is used to measure the RF current flowing through the wafer cavity and the lower electrode. The RF current measured by the coil sensor 116 is used to confirm ignition of plasma in the wafer cavity.

Although various embodiments have been discussed with reference to a chamber having a powered upper electrode and grounded base electrode, variations of these embodiments are also possible. For example, in one embodiment, a process chamber 102 is defined wherein the upper electrode 154 is electrically grounded and the lower electrode 110 is coupled to a RF power source 150 through a match network. In this embodiment, a voltage-current (VI) probe 152 is disposed outside the process chamber 102 between the RF power source 150 and the lower electrode 110 and is used to measure RF characteristics of RF power provided to the process chamber 102 through the lower electrode 110. A coil sensor 116 is disposed at the upper electrode 154 that is extending outside the process chamber 102 to measure the RF characteristics of the RF power delivered to the process chamber 102.

As in other embodiments, the coil sensor 116 is coupled to an input-output controller (IOC) 174 to relay the signals related to the RF characteristics measured by the coil sensor 116. The IOC 174 processes the signals and present appropriate information for rendering on a user interface of a computing device that is communicatively coupled to the IOC 174.

Figure 4A:
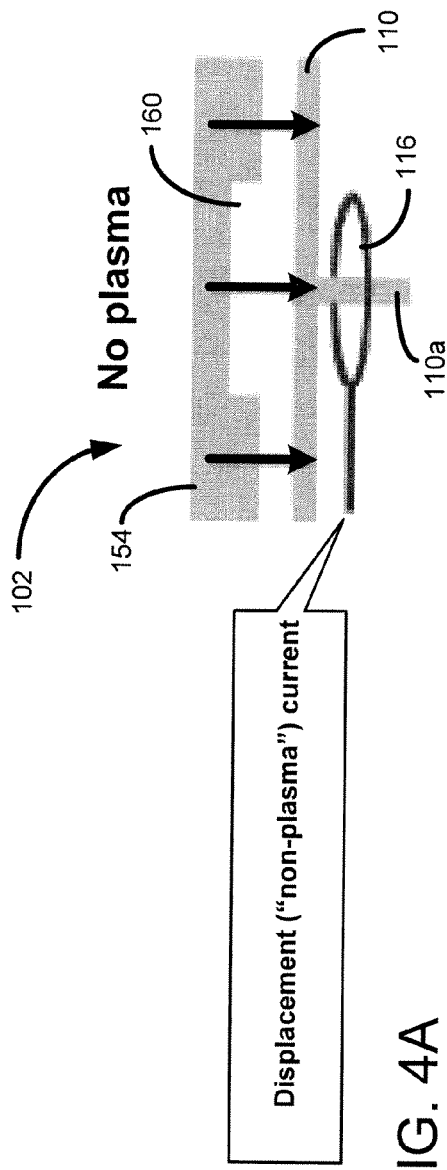
FIG. 4A-4B illustrate an example of no-plasma and plasma within a wafer cavity, and use of a coil sensor to measure displacement current to verify plasma ignition, in one embodiment of the invention.

FIG. 4A illustrates a simplified rendition of a process chamber 102 during measurement of displacement current, in one embodiment. As illustrated, the displacement current measured by the coil sensor 116 is for non-plasma condition detected in process chamber 102. The displacement current relates to parasitic current that is caused by parasitic capacitance C1 and C2 detected in the process chamber. The displacement current is measured by the coil sensor 116 disposed at a base 110a of the lower electrode 110. In some embodiments, the displacement current and the parasitic capacitance are used to determine other RF characteristics, such as impedance. The impedance measurement obtained from the displacement current is termed as "dark" impedance as the measurement relates to non-plasma condition within the process chamber 102.

Figure 4B:
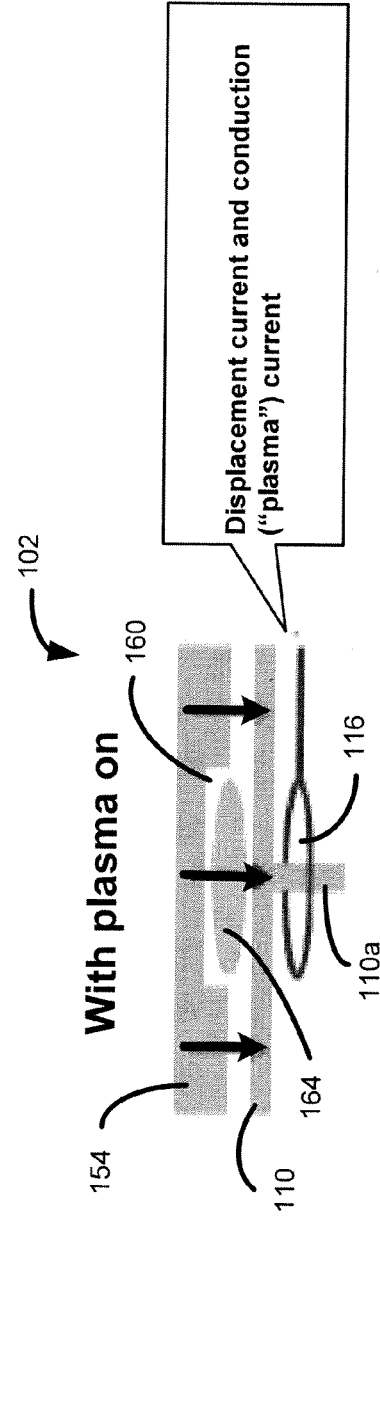

FIG. 4B illustrates a simplified rendition of a process chamber 102 during measurement of RF current by the coil sensor 116 that confirms plasma-on condition, in one embodiment. The RF current detected by the coil sensor 116 includes the displacement current and conduction current flowing through the wafer cavity 160 toward the base of the lower electrode 110. As noted above, the displacement current is caused by parasitic capacitance C1 and C2 detected in the process chamber 102. Knowing the value of the displacement current (e.g., typically about <6 amps) for the plasma chamber 102 and the voltage detected for the RF power applied to the plasma chamber 102, it is possible to determine plasma ignition in the wafer cavity 160. For example, plasma ignition may be confirmed by comparing the RF current value measured by the coil sensor 116 and the voltage value measured by the VI probe 152 against a base reading measurement established for the power level applied to the process chamber 102.

Figure 5:
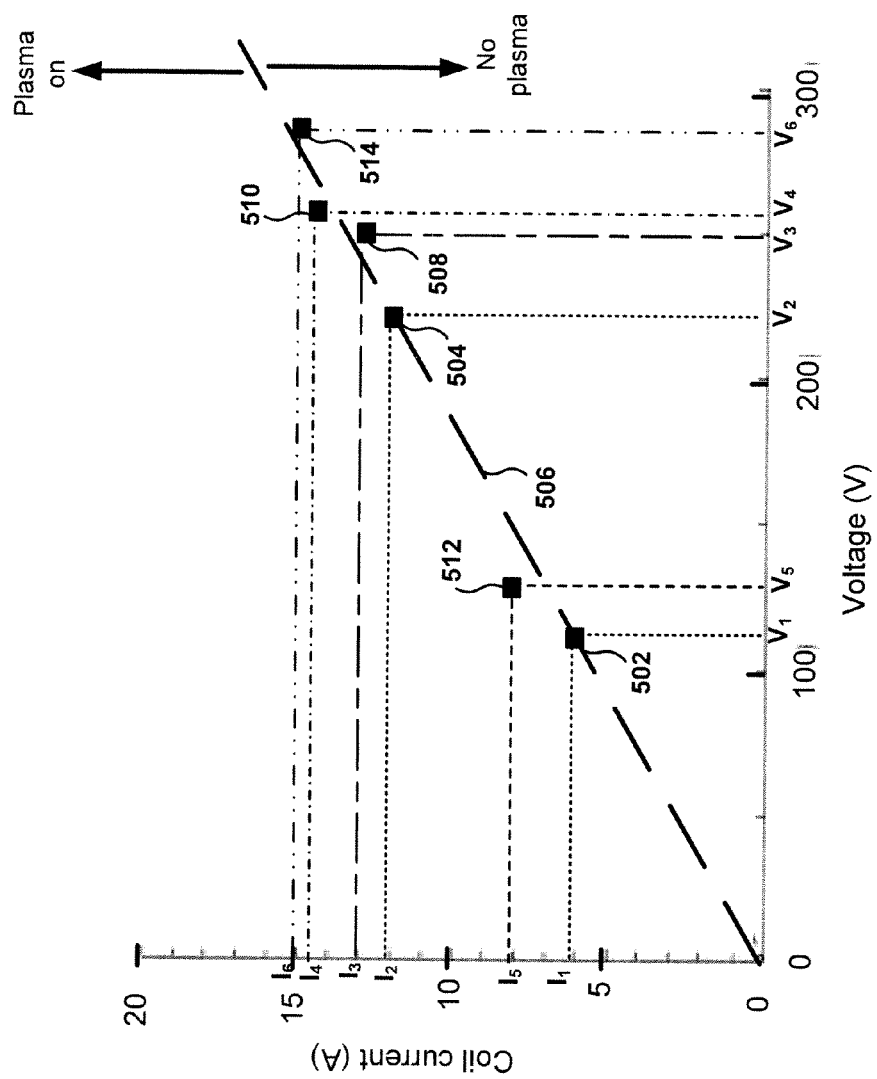
FIG. 5 illustrates an example graph of voltage detected at plasma and coil current detected by a coil sensor, in one embodiment of the invention.

FIG. 5 illustrates a graph plotting voltage (due to RF power) against coil current (i.e., RF current) measured by the coil sensor 116 for confirming ignition of plasma in wafer cavity 160, in one embodiment. In one embodiment, a method is provided that enables determination of a dividing line 506 (e.g., baseline), that identifies when plasma will be on in the wafer cavity 160 and no plasma will be present in the wafer cavity 160, when the coil sensor 116 is implemented.

In one embodiment, the dividing line 506 is identified by conducting measurements when it is known that no plasma will be generated. In one embodiment, knowledge that no plasma will be generated is based on a measurement of phase difference (□) between voltage and current, as measured by the VI probe 152. For example, from experimentation, it is known that no plasma will be generated when the phase difference is close to −90 degrees.

In one embodiment, a first power setting is provided to the process chamber 102 by RF power source 150. This first power setting will be used to identify a first plot point 502 on graph 500. The first plot point 502 corresponds to voltage $V_1$ for the first power setting applied to the process chamber 102, and the current sensed by the coil sensor 116 (i.e., "coil current") for the first power setting is $I_1$. The first power setting is known to not cause plasma ignition, and this can be verified by confirming that the phase difference as measured by VI probe 152 is close to −90 degrees. Next, a second power setting will be used to identify a second plot point 504 on the graph 500. The second power setting is provided to the process chamber 102 by RF power source 150. This second power setting is greater than the first power setting, but is still known to not cause plasma ignition. The second plot point 504 corresponds to voltage $V_2$ and the measured coil current for the applied second power setting corresponds to $I_2$. Again, the second power setting can be verified to not be generating a plasma by confirming that the phase difference is close to −90 degrees. At this point, the first plot point 502 and the second plot point 504 can be used to identify the dividing line 506, i.e., a baseline. The dividing line 506 provides plot points that represent the base reading measurement 174a for voltage and current measurements for no-plasma condition within the wafer cavity 160.

With the dividing line 506 set for the plasma chamber 102, it is now possible to use the coil sensor 116 to measure a current value conducting through the base 110a of the lower electrode 110 of the process chamber 102 during operation with a third power level (e.g., a power level used during one or more processing operations). The coil current for the third power level is measured and used to verify if plasma is ignited in the wafer cavity during a plasma process operation. For example, at plot point 508, it can be determined that the voltage of the RF power supplied to the process chamber 102 was $V_3$, and the coil current $I_3$ measured by the coil sensor 116 is about 13 amps (A). Comparing the values of the voltage $V_3$ and coil current $I_3$ of plot point 508 against the values of the plot points on the dividing line 506, it can be determined that no plasma is ignited in the wafer cavity 160. This can be further verified by confirming that the phase difference as measured by the VI probe 152 is close to −90 degrees.

In another example, plot point 510 corresponds to voltage $V_4$ for the third power level applied to the process chamber 102 and the coil current $I_4$ measured is about 14 A. Comparing the values of the voltage $V_4$ and coil current $I_4$ corresponding to plot point 510 against the values related to the plot points on the dividing line 506, it can be determined that plasma is ignited in the wafer cavity 160.

It is to be noted that not all voltage, coil current values above a certain value cause ignition of plasma in the wafer cavity 160. Similarly, not all voltage, coil current values that are low relate to non-plasma condition in the wafer cavity 160. It can be confirmed that plasma ignition occurs in the wafer cavity 160 for the voltage and coil current values that are low so long as the voltage and coil current values are above the voltage, current values corresponding to the plot points of the slope of the dividing line 506. Similarly, it can be confirmed that no plasma is ignited in the wafer cavity 160 for the voltage and coil current values that are below the voltage, current values corresponding to the plot points of the slope of the dividing line 506. For example, consider plot point 512 corresponding to voltage $V_5$, which results in the sensed coil current $I_5$ of about 8 A. Although the sensed coil current $I_5$ is low in value, it is above the plot points related to the slope of the dividing line 506. As a result, the sensed coil current $I_5$ would confirm plasma ignition in the wafer cavity 160. The low coil current sensed by the coil sensor 116, for example, may be due to low density of the plasma ignited in the wafer cavity 160, which may be due to low RF power applied to the process chamber 102.

In another example, when the sensed coil current value is high, the plasma may still not be ignited in the wafer cavity 160. Consider plot point 514 corresponding to voltage $V_6$, which results in the sensed coil current $I_6$ of about 15 A. Although the coil current $I_6$ sensed by the coil sensor 116 is high, no plasma is ignited in the process chamber 102 as the voltage $V_6$ and the coil current $I_6$ values corresponding to plot point 514 fall below the corresponding plot points of the dividing line 506. Thus, based on the measurements from the coil sensor 116, plasma ignition can be determined.

In an alternative embodiment, it is possible to identify the dividing line 506 slope using data obtained from a network analyzer. Of example, the network analyzer can be used to sense and measure the dark impedance associated with capacitance C1 and C2 detected in the process chamber 102. The measurements made by the network analyzer can then be used to derive a slope of the dividing line 506. Once the dividing line 506 is found for the process chamber 102, subsequent measurements made using the coil sensor 116 can be used to make determinations as to whether plasma is ignited or not ignited in the wafer cavity 160 for the power setting applied to the process chamber 102. The measurements obtained from the coil sensor can be used to assess station-to-station and tool-to-tool matching. Station or tool matching may be achieved, in one embodiment, by matching the RF characteristics measured by the coil sensor 116 and the VI probe 152 at different stages of the deposition process of one station or tool with that of another station or tool to obtain similar plasma conditions within the respective stations or tools. In this embodiment, the measurement from the VI probe 152 may be used to determine base reading measurement of RF characteristics for the process chamber 102. Once the base reading measurement of RF characteristics are determined for non-plasma condition, measurement from coil sensor 116 obtained at different stages of the deposition process may be compared to the base reading measurement of RF characteristics to determine plasma ignition. The matching of measurement obtained from the coil sensor and verifying against the measurement from the VI probe ensures verification of plasma repeatability during the deposition process at different stations within the same process chamber or in different process chambers, or using different tools.

As noted in the various embodiments, the plasma generated within the process chamber may be correctly detected by measuring RF current at a base of the lower electrode using the coil sensor. Relying just on the RF characteristics, such as voltage, current measurement, etc., measured by the VI probe would not accurately determine ignition of plasma in the process chamber. This may be attributed to the fact that the voltage, current measured near the RF power input at the powered upper electrode by the VI probe includes not only the RF characteristics related to the RF power flowing through the wafer cavity, but also RF characteristics due to any RF path between the VI probe and ground. Accurately determining plasma ignition in the wafer cavity of the process chambers is critical especially for the process chambers that do not provide any visual or optical access to the wafer cavity and when the parasitic capacitance is comparable with the capacitance of the wafer cavity. The measurements obtained from the coil sensor and comparing them with measurement obtained using the VI probe can accurately confirm ignition of plasma in the wafer cavity. The phase difference measurements from the VI probe may be used to additionally verify plasma ignition in the wafer cavity.

When intensity of parasitic plasma is non-negligible or when a magnitude of parasitic capacitance is comparable to capacitance of the wafer cavity, just matching the RF characteristic measurements, obtained through a VI probe, of a first processing station with that of a second processing station would not result in matched properties for the plasma ignited in the wafer cavity of the respective first and the second processing stations. This is due to the fact that the VI probe measures both the conduction current (i.e., RF current conducting through the wafer cavity) as well as the displacement current (i.e., RF current due to parasitic capacitive coupling to ground). Such parasitic current would cause variation in the plasma properties as the value of the parasitic current is influenced by the variation in the parasitic plasma and/or parasitic capacitive coupling and is not fully indicative of plasma ignition conditions within the process chamber. The coil sensor provides measurements that can be used to more accurately assess station-to-station or tool-to-tool matching. The VI probe measurements (e.g., phase difference related to voltage and current) may be used to verify the plasma ignition result from the coil sensor measurements. The accurate assessment may be attributed to the fact that the coil sensor is able to accurately measure the conduction current through the wafer cavity.

In one embodiment, in a multi-processing station process chamber, each processing station may be equipped with its own coil sensor and VI probe for measuring the RF characteristics for the supplied RF power at the respective processing stations. As a result, the RF characteristic measurements of a first processing station obtained using a first coil sensor and verified using measurements from a first VI probe can be matched with corresponding RF characteristic measurements of a second processing station obtained using a second coil sensor and a second VI probe. Such matching would result in a more accurate matching of the properties of the plasma generated in the wafer cavity at the first and the second processing stations, respectively. The RF characteristic measurements obtained using the coil sensor is not influenced by the variations due to the parasitic plasma/ parasitic capacitance detected in the process chamber 102. This ensures repeatability of processing condition within different stations that influences generation and accurate confirmation of plasma during the deposition process.

Figure 6:
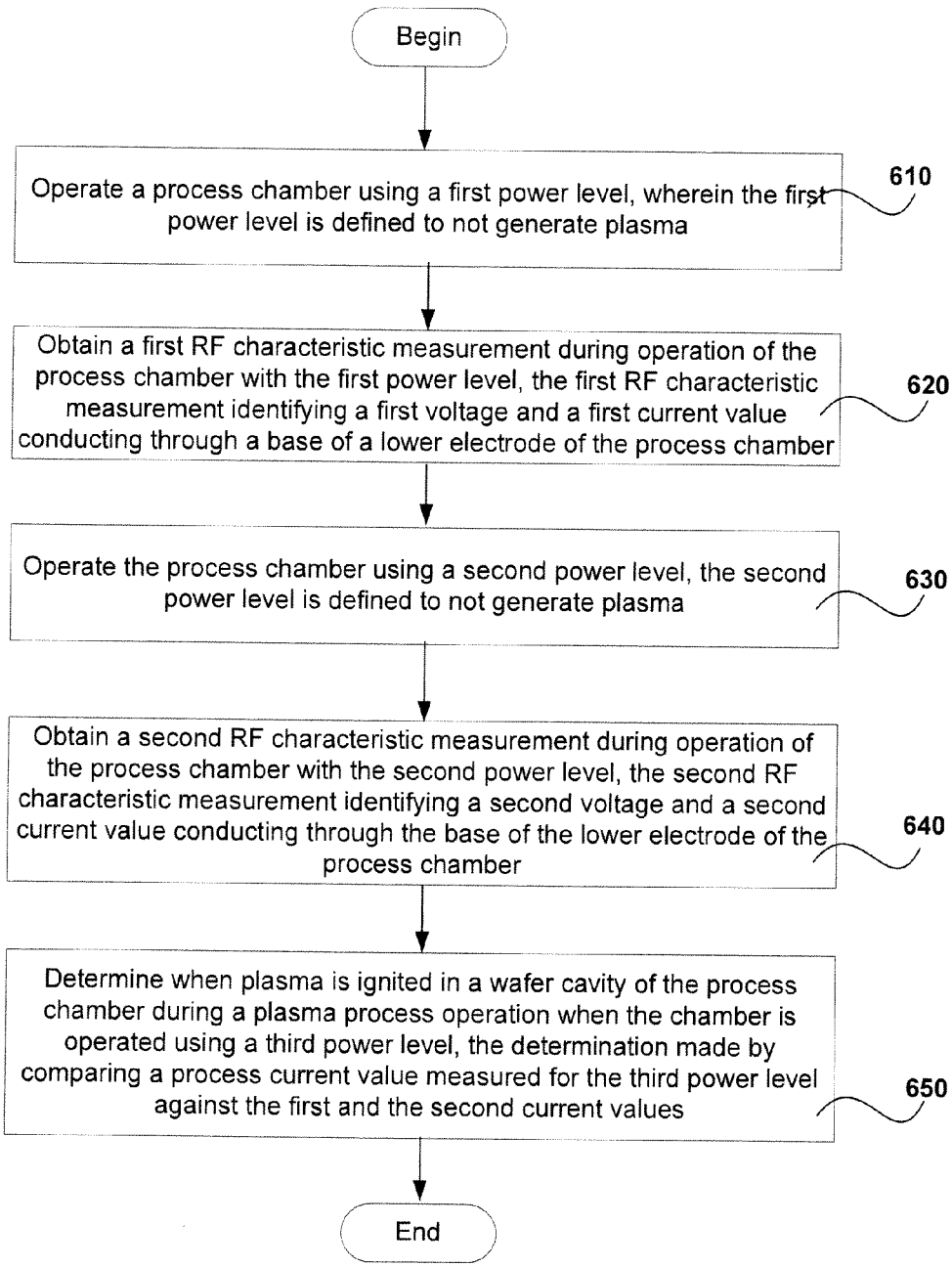
FIG. 6 illustrates process flow operations followed for measuring operational parameters of a process chamber, in one embodiment of the invention.

FIG. 6 illustrates process operations of a method for measuring operational parameters of a process chamber, in one embodiment. The method begins at operation 610 wherein the process chamber is operated using a first power level that is lower than a power required to ignite a plasma in a wafer cavity of the process chamber. A first RF characteristic measurement including first current value conducting through a base of a lower electrode for a first voltage detected in the process chamber is measured during operation of the process chamber with the first power level, as illustrated in operation 620. The first RF characteristic may represent one of a base value reading measurement. The process chamber is operated using a second power level that is lower than the power required to ignite the plasma in the wafer cavity, as illustrated in operation 630. A second RF characteristic measurement including second current value conducting through the base of the lower electrode for a second voltage detected in the process chamber is measured during operation of the process chamber with the second power level, as illustrated in operation 640. The second RF characteristic may represent a second one of a base value reading measurement for the process chamber. The first the second RF characteristic measurement are used to determine base reading measurement of RF characteristics for the process chamber.

The process chamber is operated at a process power level that is different from the first and the second power level. A process current value conducting through the base of the lower electrode is measured for the process voltage detected in the process chamber during a plasma process operation and a determination is made of when the plasma is ignited in the wafer cavity during the plasma process operation by comparing the process current value against the first and the second current values defined in the base reading measurement of RF characteristics, as illustrated in operation 650. The first, the second and the process current values are measured by a coil sensor that is disposed at a base of a lower electrode outside of the process chamber and these measurements are used to confirm plasma presence in the wafer cavity. Determination of the plasma ignition in the process chamber may be verified using phase difference between the voltage and current detected in the process chamber, as provided by the VI probe.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A process chamber for detecting formation of plasma during processing of a semiconductor wafer, the process chamber comprising,
    an upper electrode, the upper electrode including a plurality of inlets for supplying a gas chemistry to the process chamber, the upper electrode connected to a radio frequency (RF) power source through a match network to provide RF power to generate a plasma;
    a lower electrode for supporting the semiconductor wafer, the lower electrode is disposed within the process chamber so as to define a wafer cavity between a surface of the upper electrode and a top surface of the lower electrode, wherein the lower electrode is electrically grounded; and
    a coil sensor disposed at a base of the lower electrode that extends outside the process chamber, the coil sensor disposed to substantially surround the base of the lower electrode, the coil sensor configured to measure characteristics of RF current conducting through the wafer cavity and to exclude current due to parasitic plasma and parasitic capacitive coupling to ground, the characteristics of RF current used to confirm generation of the plasma within the wafer cavity.

2. The process chamber of claim 1, further includes a voltage-current probe disposed outside of the process chamber, between the RF power source and the upper electrode to measure characteristics of the RF power delivered to the process chamber.

3. The process chamber of claim 1, further includes a ring disposed at an outer periphery of the surface of the upper electrode, the ring defining a pocket in the wafer cavity to substantially contain the plasma.

4. The process chamber of claim 3, wherein the ring is made of ceramic material.

5. The process chamber of claim 1, wherein the upper electrode functions as a showerhead.

6. The process chamber of claim 1, wherein one end of the coil sensor is coupled to an input-output controller, the input-output controller is communicatively connected to a user interface of a computing device so as to render information associated with characteristics of the RF current measured by the coil sensor.

7. The process chamber of claim 1, further includes an edge ring disposed adjacent to the wafer, when present, and configured to surround the wafer, wherein the edge ring is made of ceramic material.

8. The process chamber of claim 1, wherein the coil sensor is an induction coil-based sensor.

9. A process chamber, comprising,
an upper electrode coupled to a radio frequency (RF) power supply;
a lower electrode coupled to ground, wherein a wafer cavity is defined between the upper electrode and the lower electrode;
a base coupled to the lower electrode, the base is configured to extend into the process chamber from below the process chamber, such that the base has an inner portion that is inside the process chamber and an outer portion that is outside the process chamber;
a circular channel defined around the outer portion of the base; and
a coil sensor disposed in the circular channel so that the coil sensor substantially surrounds the outer portion of the base, wherein a first end of the coil sensor is connected to an input-output controller and a second end of the coil sensor is proximate to the first end when the coil sensor is disposed in the circular channel.

10. The process chamber of claim 9, wherein the coil sensor forms a loop around the outer portion of the base.

11. The process chamber of claim 9, wherein the coil sensor has an inner conductor extending from the first end to the second end and a wrapping conductor that returns from the second end to the first end, such that the inner conductor and the wrapping conductor both terminate at the first end.

12. The process chamber of claim 9, wherein the coil sensor is flexible, such that the coil sensor can be inserted into the circular channel so that the second end wraps around an inside of the circular channel.

13. The process chamber of claim 9, wherein the first end of the coil sensor is connected to a coaxial connector that interfaces with the input-output controller.

14. The process chamber of claim 9, wherein the circular channel is disposed above a bellows that surrounds a portion of the outer portion of the base.

15. The process chamber of claim 9, wherein the circular channel surrounds a dielectric O-ring.

16. The process chamber of claim 9, wherein the circular channel is located below a base of the chamber, outside of the chamber.

17. The process chamber of claim 9, wherein the coil sensor is configured to measure a current conducting through the base.

18. The process chamber of claim 17, wherein the current conducting through the base, as measured by the coil sensor is compared to saved current measurements to determine when a plasma is ignited within the wafer cavity.

* * * * *